United States Patent
Wu

(10) Patent No.: US 8,514,634 B1
(45) Date of Patent: Aug. 20, 2013

(54) MULTI-PROTOCOL GEARBOX

(75) Inventor: Ephrem C. Wu, San Mateo, CA (US)

(73) Assignee: Xilinx, Inc., San Jose, CA (US)

( * ) Notice: Subject to any disclaimer, the term of this patent is extended or adjusted under 35 U.S.C. 154(b) by 52 days.

(21) Appl. No.: 13/237,046

(22) Filed: Sep. 20, 2011

(51) Int. Cl.
*G11C 7/00* (2006.01)
*G11C 11/419* (2006.01)

(52) U.S. Cl.
CPC ................ *G11C 11/419* (2013.01)
USPC ........... 365/189.011; 365/156; 365/189.15; 365/189.16; 365/233.11; 365/189.04

(58) Field of Classification Search
CPC ............. G11C 11/417; G11C 11/419
USPC .......... 365/189.011, 189.04, 189.14, 189.15, 365/189.16, 156
See application file for complete search history.

(56) References Cited

U.S. PATENT DOCUMENTS 4,775,942 A * 10/1988 Ferreri et al. ............. 365/51

* cited by examiner

*Primary Examiner* — Thong Q Le
(74) *Attorney, Agent, or Firm* — Kevin T. Cuenot

(57) ABSTRACT

A system can include write circuitry configured to implement a write finite state machine selected from a plurality of write finite state machines and read circuitry configured to implement a read finite state machine selected from a plurality of read finite state machines. The system also can include a multi-port memory having a write port controlled by the write circuitry and a read port controlled by the read circuitry. The write circuitry and the read circuitry can be configured to implement the selected write finite state machine and the selected read finite state machine to perform one of a plurality of different data transformations using the multi-port memory.

20 Claims, 9 Drawing Sheets

MULTI-PROTOCOL GEARBOX

FIELD OF THE INVENTION

One or more embodiments disclosed within this specification relate to semiconductor integrated circuits (ICs). More particularly, one or more embodiments relate to a gearbox that can implement multiple protocols.

BACKGROUND

The Open Systems Interconnection model (OSI model) includes seven different layers. The layers, in general, serve as a way to segment communication systems into different parts. Listed in order from one to seven, these layers include the physical layer, the data link layer, the network layer, the transport layer, the session layer, the presentation layer, and the application layer. Each layer can provide particular services to the layer above, e.g., where layer "N" can provide services to layer "N+1." Further, each layer can request services from the layer below, e.g., where layer "N" can request services from layer "N−1."

The physical layer is the first layer of the OSI model and is also referred to as the "PHY." The PHY defines the electrical and physical specifications for devices. The PHY generally defines the relationship between a device and a transmission medium, such as a copper or optical cable. For example, the PHY can include, or define, pin layouts, voltages, cable specifications, hubs, network adapters, or the like.

In one example, the PHY can include a sub-layer referred to as the Physical Coding Sublayer (PCS). In general, the PCS can perform functions or services such as auto-negotiation and coding. In some cases, the width of the data path of the PHY is not the same as the width of the PCS. Consider an example in which a transceiver PHY is configured to convert serial data at 28 gigabits per second (Gbps) to 40-bit parallel words with a 700 MHz clock. The PCS circuitry, however, may be configured to work with 66-bit words. Thus, a data transformation is needed to convert the 40-bit parallel words clocked with a 700 MHz clock to 66-bit words.

An adapter can be used to perform the needed data transformation. Adapter circuitry, referred to as a "gearbox," can be included between the transceiver of the PHY and the PCS. A gearbox can be configured to adapt the width of the PHY data path to the width of the PCS data path. There are a variety of different protocols that can be implemented within the PCS circuitry. Each protocol has specific requirements as to the format, e.g., width and clock speed, used for the data path. Due to the availability of these different protocols, the type of data transformation that is needed can vary significantly based upon the requirements of the particular protocol that is implemented within the transceiver and PCS circuitry.

SUMMARY

One or more embodiments disclosed within this specification relate to semiconductor integrated circuits (ICs) and, more particularly, to a gearbox that can implement multiple protocols.

An embodiment can include a system. The system can include write circuitry configured to implement a write finite state machine selected from a plurality of write finite state machines and read circuitry configured to implement a read finite state machine selected from a plurality of read finite state machines. The system further can include a multi-port memory having a write port controlled by the write circuitry and a read port controlled by the read circuitry. The multi-port memory can be a bit-addressable memory. The write circuitry and the read circuitry can be configured to implement the selected write finite state machine and the selected read finite state machine to perform one of a plurality of different data transformations using the multi-port memory.

Another embodiment can include a system that includes a first die including adapter circuitry configured to implement a data transformation selected from a plurality of data transformations. The system also can include a second die having physical coding sublayer (PCS) circuitry coupled to the adapter circuitry. The PCS circuitry can be configured to check alignment of data received from the adapter circuitry.

Another embodiment can include a method of adapting width of a data stream. The method can include, responsive to receiving data formatted according to a first bit-width, writing the data into a bit addressable memory using a first addressing scheme. The method also can include reading the data out of the bit addressable memory in a format corresponding to a second bit-width that is different from the first bit-width using a second addressing scheme that is different from the first addressing scheme.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to semiconductor integrated circuits (ICs) and, more particularly, to a gearbox that can be configured to implement multiple, different protocols. An exemplary architecture for adapter circuitry such as a gearbox can incorporate a variety of configurable circuit resources that can be reused to implement each of a plurality of different, supported protocols. The circuit resources can include read circuitry, write circuitry, and a memory.

The write circuitry can be configured to implement any of a variety of different write finite state machines. The write finite state machines control the manner in which data is written into the memory. Similarly, the read circuitry can be configured to implement any of a variety of different read finite state machines. The read finite state machine can control the manner in which data is read out of the memory. The configured write circuitry and read circuitry can control reading and writing to the memory, which can be a bit addressable memory, to support multiple different protocols.

By properly configuring the circuit resources, the gearbox can implement any of a variety of different protocols to perform any of a variety of data transformations. The gearbox architecture allows the circuit resources to be reused despite the particular protocol that is implemented and data transformation that is performed thereby reducing, if not eliminating, the need to include multiple different versions of circuits for each protocol, or type of data transformation, that is supported by the gearbox.

Figure 1:
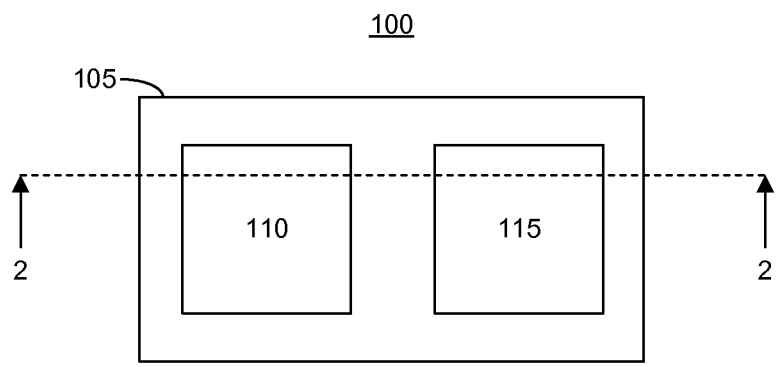
FIG. 1 is a first block diagram illustrating a topographic view of a multi-die integrated circuit (IC) in accordance with an embodiment disclosed within this specification.

FIG. 1 is a first block diagram illustrating a topographic view of a multi-die IC structure (IC structure) 100 in accordance with an embodiment disclosed within this specification. In one aspect, IC structure 100 illustrates a packaging approach to stacking multiple dies of an IC within a single package. IC structure 100 can include a silicon interposer (interposer) 105, a die 110, and a die 115.

Interposer 105 can be a die having a planar surface on which dies 110 and 115 can be horizontally stacked. As shown, dies 110 and 115 can be located on the planar surface of interposer 105 side-by-side. Although implemented with two horizontally stacked dies within FIG. 1, IC structure 100 also can be implemented with more than two dies being horizontally stacked. In another embodiment, die 115 can be stacked vertically on top of die 110. In still another embodiment, interposer 105 can be used as an intermediate layer between two vertically stacked dies. In that case, interposer 105 can isolate vertically stacked dies from one another within a multi-die IC package.

Interposer 105 can provide a common mounting surface and electrical coupling point for two or more dies of a multi-die IC structure. Interposer 105 can serve as an intermediate layer for interconnect routing between dies or as a ground or power plane for IC structure 100. Interposer 105 can be implemented with a silicon wafer substrate, whether doped or un-doped with an N-type and/or a P-type impurity. The manufacturing of interposer 105 can include one or more additional process steps that allow the deposition of one or more layer(s) of metal interconnect. These metal interconnect layers can include aluminum, gold, copper, nickel, various silicides, and/or the like.

Interposer 105 can be manufactured using one or more additional process steps that allow the deposition of one or more dielectric or insulating layer(s) such as, for example, silicon dioxide. In general, interposer 105 can be implemented as a passive die in that interposer 105 can include no active circuit elements. In another aspect, however, interposer 105 can be manufactured using one or more additional process steps that allow the creation of active circuit elements such as, for example, transistor devices and/or diode devices. As noted, interposer 105 is, in general, a die and can be characterized by the presence of one or more TSVs as will be described in greater detail within this specification.

Figure 2:
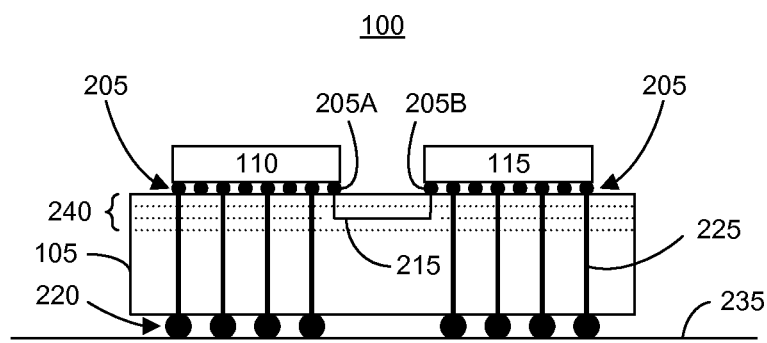
FIG. 2 is a second block diagram illustrating a cross-sectional side view of a multi-die IC structure in accordance with another embodiment disclosed within this specification.

FIG. 2 is a second block diagram illustrating a cross-sectional side view of a multi-die IC structure in accordance with another embodiment disclosed within this specification. More particularly, FIG. 2 illustrates a view of IC structure 100 of FIG. 1 taken along cut-line 2-2. As such, like numbers will be used to refer to the same items throughout this specification.

Referring to FIG. 2, each of dies 110 and 115 can be electrically coupled to interposer 105 via solder bumps 205. In addition, each of solder bumps 205 can serve to physically attach dies 110 and 115 to interposer 105. Through solder bumps 205, for example, interposer 105 is coupled to die 110. Similarly, through solder bumps 205, die 115 is coupled to interposer 105. In an embodiment, solder bumps 205 can be implemented in the form of "micro-bumps."

Although the coupling of dies 110 and 115 to interposer 105 is accomplished through solder bumps 205, a variety of other techniques can be used to couple interposer 105 to dies 110 and 115. For example, bond wires or edge wires can be used to couple dies 110 and 115 to interposer 105. In another example, an adhesive material can be used to physically attach dies 110 and 115 to interposer 105. As such, the coupling of dies 110 and 115 to interposer 105 via solder bumps 205, as illustrated within FIG. 2, is provided for purposes of illustration and is not intended to limit the one or more embodiments disclosed within this specification.

Interconnect material within interposer 105 can be used to form inter-die wires that can pass inter-die signals between dies 110 and 115. A region labeled 240 of interposer 105 can include one or more conductive, e.g., patterned metal, layers forming wires or interconnects. For example, interconnect 215 can be formed using one or more of the patterned metal layers of region 240. Accordingly, interconnect 215 can represent an inter-die wire that can couple each of solder bumps 205A and 205B, thereby coupling die 110 to die 115 and allowing the exchange of inter-die signals between dies 110 and 115. In addition, interposer 105 can be implemented with multiple conductive layers that can be coupled together with vias (not shown). In that case, interconnect 215 can be implemented within two or more conductive layers coupled together using vias within interposer 105. The use of multiple conductive layers to implement interconnects, e.g., inter-die wires, within interposer 105 allows a greater number of signals to be routed and more complex routing of signals to be achieved within interposer 105.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Solder bumps 220 can be used to electrically couple interposer 105 to a surface 235. Surface 235 can represent, for example, a multi-die IC package in which IC structure 100 is implemented. Solder bumps 220 further can couple IC structure 100 directly to a node external to the multi-die IC package. In an embodiment, solder bumps 220 can be implemented in the form of "C4-bumps." For example, solder bumps 220 can be used to physically attach interposer 105 to surface 235. TSVs 225 represent vias that, when filled with conductive material, form an electrical connection that vertically transverses, e.g., extends through a substantial portion, if not the entirety of, interposer 105.

TSVs 225 can be implemented by drilling or etching an opening into interposer 105 that extends from a first planar surface, i.e., the surface to which solder bumps 205 are coupled, through to a second planar surface, i.e., the surface to which solder bumps 220 are coupled. Conductive material then can be deposited within TSVs 225. Examples of conductive material that can be used to fill TSVs 225 can include, but are not limited to, aluminum, gold, copper, nickel, various silicides, and/or the like. In another example, TSVs 225 can traverse substantially through interposer 105 to couple solder bumps 220 with one or more metal layers as are used to form interconnect 215. Interconnect 215 and one or more conventional vias then can couple TSVs 225 to solder bumps 205.

TSVs 225, in combination with solder bumps 220, couple die 110 to surface 235. As shown within FIG. 2, the first planar surface of interposer 105 can be physically coupled to dies 110 and 115. The second planar surface of interposer 105 can be physically coupled to surface 235.

In an embodiment, IC structure 100 can be configured to implement a multi-protocol gearbox. Die 110, for example, can be configured to implement one aspect of a PHY. For example, die 110 can be configured to implement a transceiver and a gearbox. Die 115, for instance, can be configured to implement another aspect of a PHY such as, for example, Physical Coding Sublayer (PCS) circuitry. Die 115 can be implemented as a programmable die, e.g., a programmable IC, whereas die 110 can be implemented as an application specific integrated circuit (ASIC) that, while configurable in some respects, need not be, or is not, programmable. As such, die 110 can be configured for high speed operation while die 115 can provide an increased level of programmability, but operate at lower frequencies than die 110.

One example of a type of IC or a die, such as die 115, that can be programmed to perform specified functions is a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" or "programmable die" can include, but is not limited to these devices and further can encompass devices that are only partially programmable. For example, one type of programmable IC includes a combination of hard-coded transistor logic and a programmable switch fabric that programmably interconnects the hard-coded transistor logic.

It should be appreciated that a programmable IC or programmable die, as used herein, refers to devices that can be configured to implement one or more different physical circuits responsive to the loading of configuration data. Prior to the loading of configuration data, the programmable circuitry is not functional. This is to be contrasted with conventional processors that simply execute program code, but do not implement different physical circuits or circuit functions.

Figure 3:
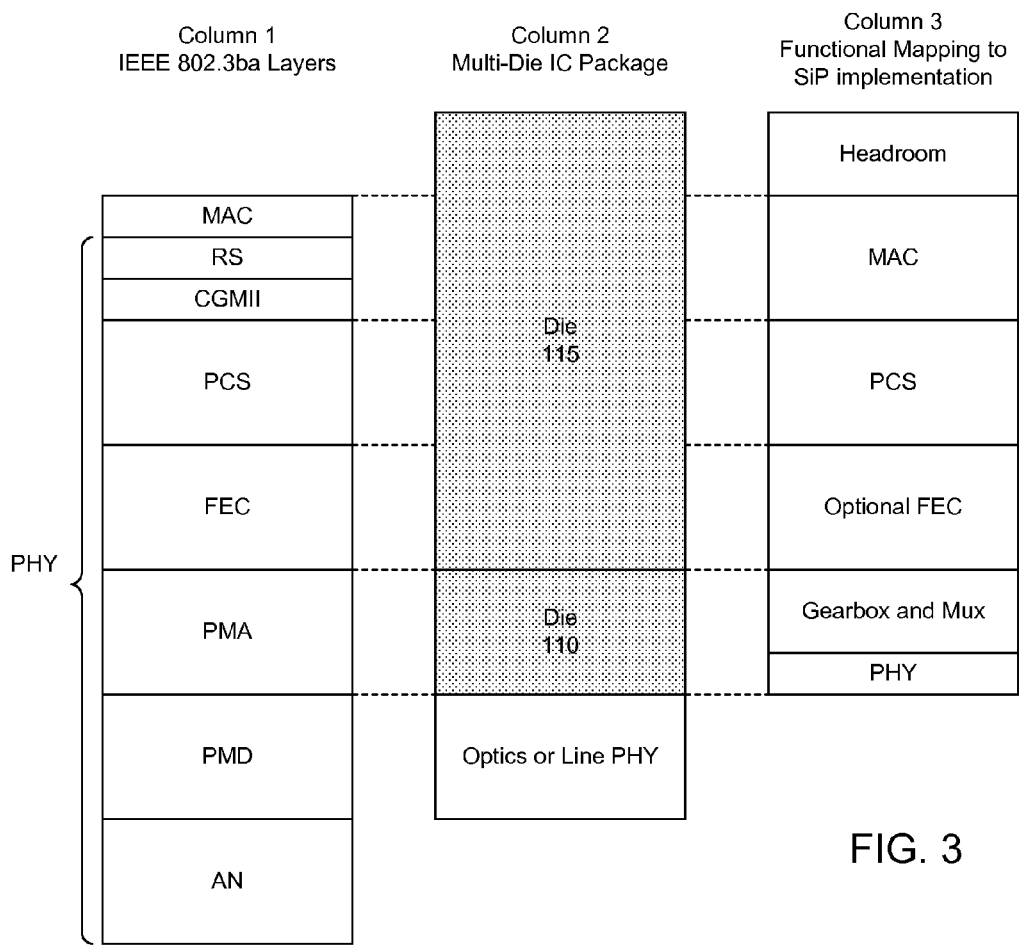
FIG. 3 is a third block diagram illustrating an application of the Open Systems Interconnection (OSI) model to a multi-die IC structure in accordance with another embodiment disclosed within this specification.

FIG. 3 is a third block diagram illustrating application of the Open Systems Interconnection (OSI) model to an IC structure in accordance with another embodiment disclosed within this specification. More particularly, FIG. 3 illustrates the relative position and function of dies 110 and 115 of IC structure 100 of FIG. 1 as applied to the OSI model in implementing a multi-protocol gearbox.

Column 1 illustrates exemplary layers of the IEEE 802.3ba protocol. Each of the layers within column 1 is within the physical layer (PHY) and/or the data link layer of the OSI model. The data link layer includes the Media Access Control (MAC) sublayer. The PHY includes a Reconciliation Sublayer (RS) and a 100 Gbps Media Independent Interface (CGMII). The PHY further includes a Physical Coding Sublayer (PCS), Forward Error Correction (FEC), a Physical Medium Attachment (PMA) sublayer, a Physical Medium Dependent (PMD) sublayer, and an Auto-Negotiation (AN) sublayer.

Column 2 illustrates the various ones of the PHY sublayers as they correspond to the dies of a multi-die IC. In the example pictured in FIG. 3, die 110 can be configured to include the PMA sublayer. Within die 110, which includes the PMA sublayer, a multiprotocol gearbox, or portion thereof, can be implemented. Die 115 of IC structure 100 can be configured to implement the MAC, RS, CGMII, PCS, and/or FEC sublayers.

Column 3 illustrates a functional mapping of dies 110 and 115 to a system in package (SiP) implementation. Die 110 can implement a PHY, e.g., a transceiver, and a gearbox and multiplexer. The multiplexer can be coupled to the gearbox or incorporated within the gearbox. Die 115 can implement optional FEC, a PCS, a MAC, and include additional headroom.

Figure 4:
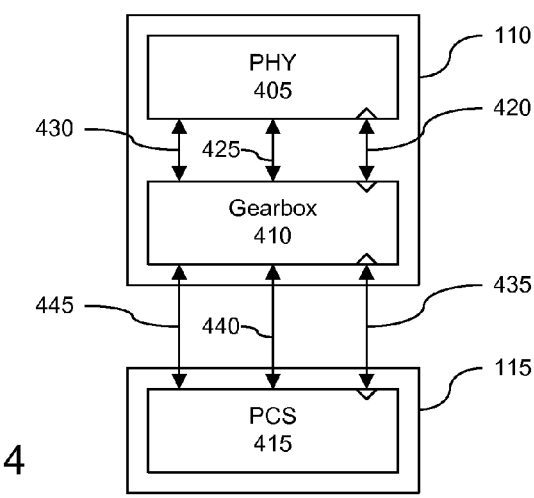
FIG. 4 is a fourth block diagram illustrating a gearbox in accordance with another embodiment disclosed within this specification.

FIG. 4 is a fourth block diagram illustrating a gearbox 410 in accordance with another embodiment disclosed within this specification. More particularly, gearbox 410 can be a multi-protocol gearbox in reference to the capability of gearbox 410 to perform multiple different types of data transformations. IC structure 100 is shown absent the interposer previously described with reference to FIGS. 1 and 2.

As shown, die 110 can include a PHY 405 and a gearbox 410. For example, PHY 405 can be a high speed transceiver, or more particularly a receiver in this example, configured to operate in the Gbps range, e.g., 10 Gbps. PHY 405 and gearbox 410 can be communicatively linked through a clock signal 420, a plurality of data signals 425, and an optional flow control signal 430. Flow control signal 430, when asserted, notifies PHY 405 not to send additional data. Clock signal 420 can be a clock signal belonging to a first clock domain corresponding to the operational speed of PHY 405, e.g., the high speed transceiver. In an embodiment, data signals 425 can be implemented as a 40-bit parallel signal. Gearbox 410, for example, can be implemented as a 40:66 gearbox. The 40:66 indicates the signal width conversion that is to be performed, wherein gearbox 410 can output a parallel data signal that includes, or specifies, a 66-bit word or a portion thereof in a format to be described herein in greater detail.

Die 115 can include a PCS 415. For example, as noted, die 115 can be implemented as a programmable die where PCS 415 is implemented using programmable circuitry. PCS 415 can be coupled to gearbox 410 via a clock signal 435, a plurality of data signals 440, and an optional flow control signal 445. Flow control signal 445, when asserted, can notify PCS 415 that data is not available for sending. Clock signal 435 can be a clock signal belonging to a second clock domain that is different from the first clock domain. In this regard, clock signal 435 can have a frequency that is different from clock signal 420, e.g., lower. In an embodiment, data signals 440 can represent a 175-bit parallel signal, e.g., 175 physical inter-die wires.

Due to the multi-die nature of IC structure 100, it should be appreciated that signals 435, 440, and 445 can be implemented as "inter-die" signals. More particularly, signals 435, 440, and 445 can be signals that pass from one die to the other via the interconnect circuitry, i.e., inter-die wires, implemented within the interposer (not shown).

The particular width conversion that is illustrated within FIG. 4 is presented for purposes of illustration only and, as such, is not intended as a limitation of the one or more embodiments disclosed within this specification. It should be appreciated that PHY data standards can include a variety of parallel word widths including, but not limited to, 8, 10, 16, 20, 32, 40 (in this example), 64, 80, or the like. Similarly, a variety of different PCS standards can include, for example, 10G Ethernet having one lane of 66-bit blocks, Interlaken having one lane of 67-bit blocks, 40G Ethernet having 4 lanes of 66-bit blocks, 100G Ethernet having 20 lanes of 66-bit blocks, or the like. A flexible gearbox implementation can perform necessary translations between one or more of the various PHY data standards and one or more of the various PCS standards.

In another embodiment, gearbox 410 can be implemented within interposer 105. For example, interposer 105 can be implemented as an active die. Accordingly, interposer 105 can include circuitry implementing gearbox 410. Gearbox 410, being implemented within interposer 105, can communicate with PHY 405 within die 110. Die 115 still can implement PCS 415.

Figure 5:
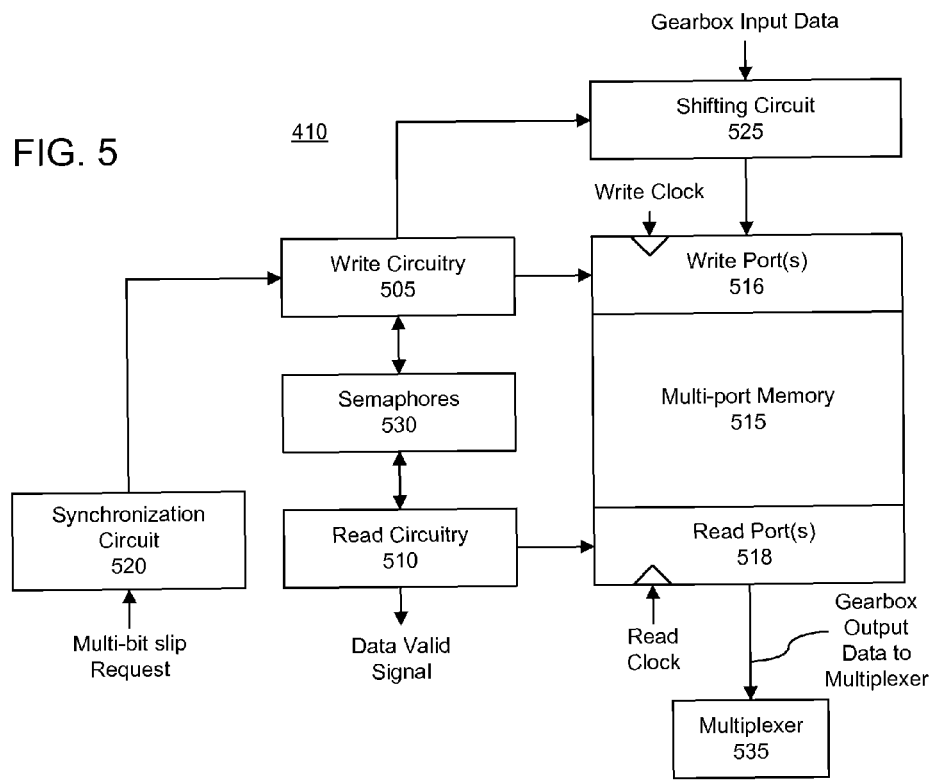
FIG. 5 is a fifth block diagram illustrating a gearbox in accordance with another embodiment disclosed within this specification.

FIG. 5 is a fifth block diagram illustrating a gearbox in accordance with another embodiment disclosed within this specification. More particularly, FIG. 5 illustrates an exemplary implementation of gearbox 410 of FIG. 4. As such, gearbox 410 can be implemented within die 110 of IC structure 100. Gearbox 410 can include write circuitry 505, read circuitry 510, and a multi-port memory (memory) 515. As shown, gearbox 410 can include a synchronization circuit 520, a shifting circuit 525, and semaphore circuitry (semaphores) 530. Gearbox 410 further can be coupled to a multiplexer 535.

Memory 515 can be implemented in the form of a bit-addressable memory. Memory 515 can include one or more write ports 516 and one or more read ports 518. Read ports 518 can be coupled to multiplexer 535. Memory 515 can be implemented in the form of a bit-addressable memory, e.g., a bit-addressable ring buffer, and further can be organized into a rectangular matrix of storage bits. Write circuitry 505 can be configured to control the writing of data to memory 515 by controlling write ports 516. Write circuitry 505, for example, can be configured to control write ports 516 to cause write ports 516 to write M-bit words of data into memory 515 each write clock cycle, where "M" is an integer value corresponding to the width of data output from the transceiver of the PHY. For purposes of illustration, M can be set equal to 40. The write clock can correspond to the first clock domain within which the transceiver operates. Thus, write circuitry 505 and write ports 516 of memory 515 can be configured to operate in the write clock domain, e.g., are clocked using the write clock.

Read circuitry 510 can be configured to control the reading of data from memory 515 by controlling read ports 518. Read circuitry 510 can be configured to control read ports 518 to cause read ports 518 to read, e.g., output, data having a width of "N" bits from memory 515 every read clock cycle, where "N" is an integer value and can be set to any of a variety of different values. In general, "N" can be set to a value larger than 66 or 67 such as, for example, 160, 170, 175, etc. For example, read ports 518 can be configured to output a 160, 170, or 175-bit signal each read clock cycle. The read clock can correspond to the second clock domain that is different from the first clock domain. As noted, the second clock domain can correspond to the die including the programmable circuitry, e.g., die 115. Read circuitry 510 can be configured to read data only when sufficient valid data bits are available in memory 515, in this case N bits, e.g., 66 or 67 valid data bits or a number of bits that is equal to the number of bits being output, e.g., 160, 170, or 175, each read clock cycle. Read circuitry 510 can indicate the presence of valid data to PCS circuitry via the data valid signal illustrated. In an embodiment, the data valid signal can represent an implementation of flow control signal 445. Flow control signal 430 is not illustrated in FIG. 5. By incorporating multiple ports where read ports 518 are controlled by a read clock and write ports 516 are controlled by a write clock, memory 515 can provide a phase compensation function.

Read circuitry 510 can be configured to operate and view memory 515 as rows of N columns of storage bits. Write circuitry 505 can be configured to control write ports 516 of memory 515 to write M bits, e.g., 40-bits, at a time into the rows of memory 515. For example, write circuitry 505 can be configured to write data, via controlling write ports 516 of memory 515, into memory 515 from the lowest indexed row to the highest, wrapping back around to the lowest. In consequence, write circuitry 505 can be configured to split a 40-bit word among two different rows of memory 515 as will be described herein in greater detail. For example, in splitting a word among two different rows, write circuitry 505 can write "40-X" bits into a first row of memory 515 using a first of write ports 516 and write "X" bits to a next adjacent row of memory 515, where "X" is an integer value less than 40 or M, using a second of write ports 516. In illustration, write circuitry 505 can write a 22-bit subword into a first row of memory 515 and an 18-bit subword into a next adjacent row of memory 515.

In implementing gearbox 410, write circuitry 505 can be configured to implement one of a plurality of different write finite state machines, where each of the finite state machines that is implementable by write circuitry 505 implements or corresponds to a particular PHY data standard and/or PCS data standard.

In one aspect, write circuitry 505, and the write finite state machine implemented by write circuitry 505, can operate in cooperation with shifting circuit 525 to write data to memory 515 to simplify logic design. For example, shifting circuit 525 can be implemented in the form of a barrel shifter. As noted, memory 515 can include multiple write ports 516. In an embodiment where memory 515 includes more than one write port, shifting circuitry 525 can include one barrel shifter for each write ports 516 of memory 515, thereby allowing multiple rows of memory 515 to be written concurrently. Shifting circuit 525 can operate in the write clock domain and support multiple protocols. Using the prior example in which 40-bit words are received, in one aspect, shifting circuit 525 can be configured to receive a 40-bit input signal as the gearbox input data. Shifting circuit 525 can be configured to output either a 66 or a 67-bit signal depending upon the particular PCS configuration that is utilized.

For example, consider the case in which the PCS standard utilizes a 67-bit width. In that case, write circuitry 505 and shifting circuit 525 can be configured to write across each of 67-bit columns of memory 515. In the case where the PCS standard utilizes a 66-bit width, write circuitry 505 and shifting circuit 525 can be configured to write across 66 of the 67 total bit columns available within memory 515. For example, write circuitry 505 and shifting circuit 525 can be configured to skip a particular column, such as the first column, when interacting with PCS circuitry using a 66-bit data width.

Despite the particular write finite state machine that is implemented, write circuitry 505 can be configured to interact with semaphores 530 to lock portions, e.g., bit addresses, of memory 515 that contain invalid data. Read circuitry 510 can be prevented from accessing any locations within memory 515 that are indicated as being locked per semaphores 530 and write circuitry 505.

Similarly, prior to write circuitry 505 writing to any bit addresses in memory 515, write circuitry 505 can check that the memory addresses within memory 515 are available per semaphores 530. Read circuitry 510, for example, can be configured to clear semaphores 530 corresponding to bit addresses that have been read by read circuitry 510, thereby freeing the bit addresses for receiving new data. In an embodiment, read circuitry 510 can be configured to poll semaphores 530 in order to identify any bits available for reading out of memory 515, e.g., whenever a group of 66 or 67 bits, as the case may be, are available to be read.

As noted, gearbox 410 can be coupled to multiplexer 535. In an embodiment, multiplexer 535 can be considered part of gearbox 410, e.g., as described with reference to FIG. 3. Multiplexer 535 can receive the data output from memory 515 from read ports 518 in the form of a plurality of data buses, e.g., 175-bit data buses, multiplex the received data, and provide a primary output that can be provided to the PCS circuitry via the inter-die wires described. Operation of multiplexer 535 is described in greater detail within this specification.

Upon reading out bits of data as the gearbox output data and providing the gearbox output data to the PCS circuitry, the PCS circuitry can perform analysis to determine whether the received data is properly aligned. In an embodiment, alignment can be determined based upon a review of the presumed or expected header portion of the received data to determine whether the examined portions include the necessary features defining a header.

When the PCS circuitry determines that the data is not aligned, the PCS circuitry can send a "multi-bit slip request" to synchronization circuit 520. The multi-bit slip request can be sent as an inter-die signal. The multi-bit slip request can specify the number of bits the data is to be shifted and/or a direction of the shift. The shift amount can be a single bit or can be more than one bit. Responsive to the multi-bit slip request, synchronization circuit 520 can instruct write circuitry 505 to effectuate a shift. Accordingly, write circuitry 505, in response, can instruct shifting circuit 525 to shift incoming data by the requested amount, e.g., number of bits, and in the requested direction.

In one embodiment, write circuitry 505 and/or read circuitry 510 can be implemented in the form of dedicated circuitry, e.g., hardened circuits. Write circuitry 505 and read circuitry 510 can be implemented using circuit elements that are not configured to execute program code, for example. In another embodiment, one or both of write circuitry 505 and read circuitry 510 can be implemented as a processor or controller that is capable of executing program code to implement the various finite state machines described within this specification.

FIGS. 4 and 5 illustrate a receive type of gearbox in which data is received from the transceiver and output to the PCS. In another embodiment, the gearbox can be configured as a transmit gearbox in which data received from the PCS is output through the transceiver, which is configured as a transmitter. For example, a system can include one or more receive gearboxes and one or more transmit gearboxes.

Figure 6:
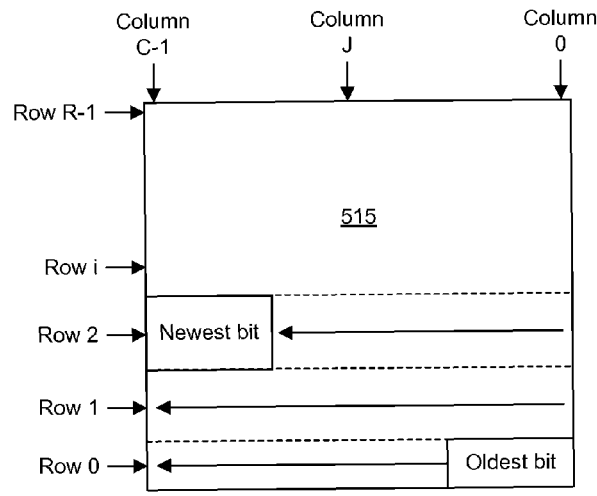
FIG. 6 is a sixth block diagram illustrating a technique for writing data to a memory of a gearbox in accordance with anther embodiment disclosed within this specification.

FIG. 6 is a sixth block diagram illustrating a technique for writing data to a memory of a gearbox in accordance with anther embodiment disclosed within this specification. More particularly, FIG. 6 illustrates an example of how data can be written to memory 515 by write circuitry 510 of FIG. 5 using write ports 516. As shown, memory 515 is organized into a number of bit columns 0 to C−1, where "C" is an integer value that specifies the total number of bit columns in memory 515. Similarly, memory 515 is organized into a plurality of rows 0 to R−1, where "R" is an integer value that specifies the total number of rows available within memory 515.

FIG. 6 illustrates that the write circuitry can be configured to write to memory 515 from right to left within each row. For example, bits can be written from right to left in row 0. The write circuitry can increment to the next row, e.g., row 1, and write bits again from right to left. The write circuitry can increment again to row 2 and write bits from right to left. It should be appreciated that the particular direction that bits are written is not intended as a limitation of the one or more embodiments disclosed within this specification so long as bits are written in a consistent direction within each respective row of memory 515.

Figure 7:
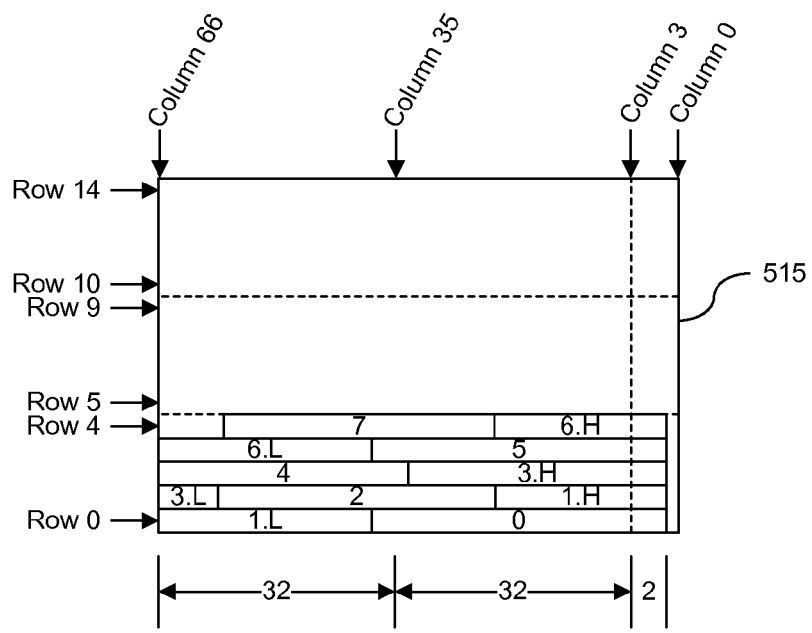
FIG. 7 is a seventh block diagram illustrating a technique for writing data to a memory of a gearbox in accordance with another embodiment disclosed within this specification.

FIG. 7 is a seventh block diagram illustrating a technique for writing data to a memory of a gearbox in accordance with another embodiment disclosed within this specification. FIG. 7 illustrates an addressing scheme that can be implemented by the write circuitry and selected write finite state machine for writing data to memory 515. More particularly, FIG. 7 illustrates an embodiment in which the write circuitry is configured to implement a write finite state machine in which 64 b/66 b scrambling is implemented within the PCS circuitry.

As shown, the write circuitry can be implemented to write M-bit words, e.g., 40-bit words, into memory 515 at a time on each write cycle. The write circuitry can be configured to begin writing at column 1, skipping column 0, in each row. Accordingly, the write circuitry can write a 40-bit word labeled word 0 into row 0 beginning at column 1. Since memory 515 includes 67 columns, but uses only 66 columns in this example, the next 40-bit word, e.g., word 1, is split between row 0 and row 1 as indicated by the notation 1.L indicating the low subword of word 1 (being on a lower row) and 1.H indicating the high subword of word 1 (being on the next higher row). Write circuitry can continue writing 40-bit words as shown into memory 515.

Figure 8:
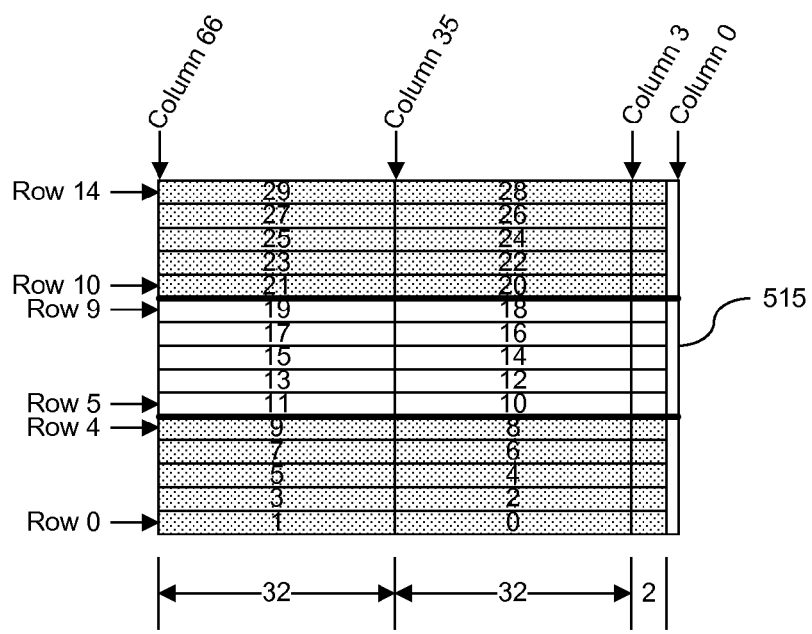
FIG. 8 is an eighth block diagram illustrating a technique for reading data from a memory of a gearbox in accordance with another embodiment disclosed within this specification.

FIG. 8 is an eighth block diagram illustrating a technique for reading data from a memory of a gearbox in accordance with another embodiment disclosed within this specification. FIG. 8 illustrates an addressing scheme that can be implemented by the read circuitry and selected read finite state machine for reading data from memory 515. More particularly, FIG. 8 illustrates an embodiment in which the read circuitry is configured to implement a read finite state machine in which 64 b/66 b scrambling is implemented within the PCS circuitry. FIG. 8 indicates operation of the read circuitry that can be used in combination with the write circuitry illustrated in FIG. 7.

The read circuitry can be configured to read out data segments as opposed to entire rows of data. A data segment can refer to a portion of the data that is less than an entire row. Data segments can be aligned with respect to columns as shown. In this example, each row can be formed of two unequal data segments.

For example, rather than output the entirety of row 0, read circuitry can view each row as a combination of two or more constituent data segments. In this example, read circuitry can read data segments ordered as 0, 2, 4, 6, and 8 from memory 515, where 170-bits of data are read out each read clock cycle.

For purposes of clarity, each of data segments 0, 2, 4, 6, and 8 can include bits from column 1 through to column 34. As such, each even data segment can include the two header bits in columns 1 and 2. For purposes of reading data from memory 515, each even data segment can be 34 bits in size and include an expected header portion.

By outputting two or more data segments, e.g., in this example 5 data segments totaling 170 bits, arranged as shown in a single read clock cycle, the circuitry receiving the data segments, e.g., the PCS circuitry, can more readily determine whether the received data is properly aligned. In the example shown in FIGS. 7 and 8, each 66-bit portion of data in a row is to include a 2-bit header portion having a predetermined bit pattern. The PCS circuitry can be configured to detect the header bits and determine whether the received data is properly aligned.

Responsive to the PCS determining that the received data is not properly aligned, e.g., the expected header bits of the even data segments do not have or exhibit the predetermined bit pattern, the PCS can submit a multi-bit slip request to the synchronization circuit of the gearbox. The synchronization circuit can, in turn, signal the write circuitry to control the shifting circuitry to shift the data that is being written into memory 515 by the requested amount. It should be appreciated that while the multi-bit slip request can specify a number of bits to shift that is greater than one, the multi-bit slip request also can request a shift of only a single bit in either direction or a shift of zero bits (i.e., no shift).

In any case, were entire rows of data read from memory 515, e.g., data segments ordered as 0, 1, 2, 3, and 4, for example, the PCS circuitry would have to wait more read cycles than is the case when reading out data segments ordered as 0, 2, 4, 6, and 8 to accumulate the same number of expected headers for comparison purposes in determining whether the received data is properly aligned. The PCS circuitry can determine alignment and establish alignment in less time from fewer data segments than otherwise would be the case. The PCS circuitry can be implemented in a manner to facilitate descrambling of the data being provided in the format described.

During the subsequent read cycles, data segments 1, 3, 5, 7, and 9 then can be output from memory 515. For purposes of reading from memory 515, each odd data segment can be 32 bits in size. Thus, the gearbox can output 160 bits each read clock cycle. When odd data segments are read, the PCS circuitry can omit, e.g., not perform, data alignment detection operations. During the next read clock cycles, data segments 10, 12, 14, 16, and 18 can be output from memory 515. When data segments are output that include the expected header bits, the PCS circuitry can again check whether the data is properly aligned with the benefit of having received a larger number of expected headers than would be the case had data segments 0, 1, 2, 3, 4, and 5 been read out sequentially (e.g., entire row by entire row).

In another embodiment, the gearbox can function with protocols that operate using byte boundaries as opposed to 66 and/or 67-bit boundaries. In such embodiments, e.g., where the protocol complies with OTN (Open Transport Network) or SONET/SDH (Synchronous Optical Networking/Synchronous Digital Hierarchy), the portions of memory 515 that typically would be utilized for storing header bits, e.g., columns 0, 1, and/or 2, can be left unused.

Figure 9:
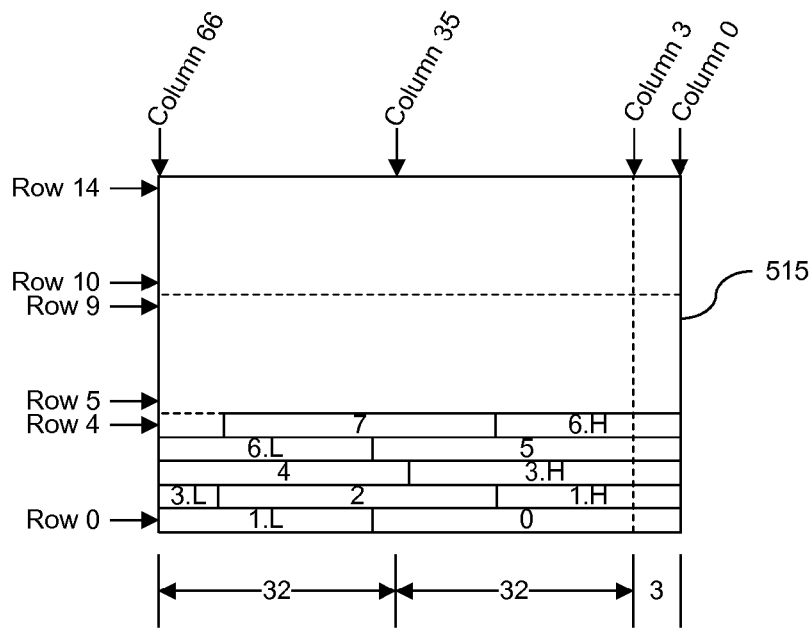
FIG. 9 is a ninth block diagram illustrating a technique for writing data to a memory of a gearbox in accordance with another embodiment disclosed within this specification.

FIG. 9 is a ninth block diagram illustrating a technique for writing data to a memory of a gearbox in accordance with another embodiment disclosed within this specification. FIG. 9 illustrates an addressing scheme that can be implemented by the write circuitry and selected write finite state machine for writing data to memory 515. More particularly, FIG. 9 illustrates an embodiment in which the write circuitry is configured to implement a write finite state machine in which 64 b/67 b scrambling is implemented within the PCS circuitry.

As shown, the write circuitry can be implemented to write M-bit words, e.g., 40-bit words, into memory 515 each write clock cycle. The write circuitry can be configured to begin writing at column 0 in each row. Accordingly, the write circuitry can write a 40-bit word labeled word 0 into row 0 beginning at column 0. Since memory 515 includes 67 columns, the next 40-bit word is split between row 0 and row 1 as indicated by the notation 1.L indicating the low subword of word 1 and 1.H indicating the high subword of word 1. Write circuitry can continue writing 40-bit words as shown into memory 515.

Figure 10:
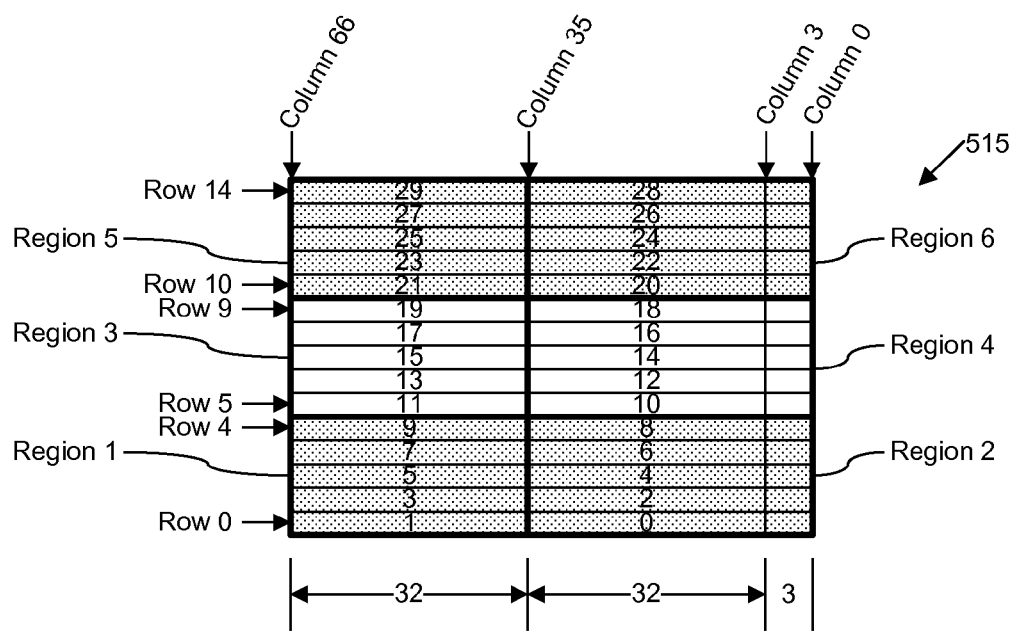
FIG. 10 is a tenth block diagram illustrating a technique for reading data from a memory of a gearbox in accordance with another embodiment disclosed within this specification.

FIG. 10 is a tenth block diagram illustrating a technique for reading data from a memory of a gearbox in accordance with another embodiment disclosed within this specification. FIG. 10 illustrates an addressing scheme that can be implemented by the read circuitry and selected read finite state machine for reading data to memory 515. More particularly, FIG. 10 illustrates an embodiment in which the read circuitry is configured to implement a read finite state machine in which 64 b/67 b scrambling is implemented within the PCS circuitry. FIG. 10 indicates operation of the read circuitry that can be used in combination with the write circuitry illustrated in FIG. 9.

For purposes of illustration, memory 515 is subdivided into a plurality of different regions. In this example, memory 515 is subdivided into six different regions. Region 1 includes data segments 1, 3, 5, 7, and 9. Region 2 includes data segments 0, 2, 4, 6, and 8. Region 3 includes data segments 11, 13, 15, 17, and 19. Region 4 includes data segments 10, 12, 14, 16, and 18. Region 5 includes data segments 21, 23, 25, 27, and 29. Region 6 includes data segments 20, 22, 24, 26, and 28.

The read circuitry can be configured to read out segments of data as opposed to entire rows of data. For example, rather than output the entirety of row 0, data segments ordered as 0, 2, 4, 6, and 8 can be read from memory 515. For purposes of clarity, each of data segments 0, 2, 4, 6, and 8 can include bits from column 0 through to column 34, e.g., include the three header bits in columns 0, 1, and 2. Thus, for purposes of reading data from memory 515, each even data segment can be 35 bits in size. When five segments including headers are output, the total number of bits can be 175 bits, with the entire 175-bits being output each read clock cycle.

By outputting two or more data segments arranged as shown, the circuitry receiving the data segments can more readily determine whether the received data is properly aligned. As noted, data is aligned when the expected header bits have or exhibit the predetermined bit pattern. In the example shown in FIGS. 9 and 10, each set of 67-bits, e.g., row, that is read out is to include a three bit header portion having a predetermined bit pattern. The PCS circuitry can be configured to detect the header bits and determine whether the received data is properly aligned. As noted, responsive to the PCS determining that the received data is not properly aligned, the PCS can submit a multi-bit slip request to the synchronization circuit of the gearbox.

Were entire rows of data read from memory 515, e.g., ordered as data segments 0, 1, 2, 3, and 4, for example, the PCS would have to wait more read cycles than is the case when reading out data segments ordered as 0, 2, 4, 6, and 8 to accumulate the same number of headers for comparison purposes to determine whether the received data is properly aligned. When odd data segments are read, the PCS circuitry can omit, e.g., not perform, data alignment detection operations. The PCS circuitry can be implemented in a manner to facilitate descrambling of the data being provided in the format described.

During the next read clock cycle, data segments 1, 3, 5, 7, and 9 can be output from memory. Again, for purposes of reading data from memory 515, each odd data segment can be 32 bits in size so that a total of 160 bits are read out in the read clock cycle. When odd data segments are read, the PCS can omit, e.g., not perform, data alignment detection operations. During the next read clock cycle, data segments 10, 12, 14, 16, and 18 can be output from memory 515. When data segments are output that include the header bits, the PCS circuitry can again check whether the data is properly aligned with the benefit of having received a larger number of presumed headers than would be the case had segments 0, 1, 2, 3, 4, and 5 been read out (e.g., in row fashion).

FIGS. 7-10 illustrate how the write addressing scheme and the read addressing scheme used for the memory of the gearbox can vary. Data written to the memory of the gearbox can be written sequentially with respect to rows and bit columns. Data read from the memory of the gearbox can be read in terms of even then odd data segments that are loosely correlated with the width of data written to the memory.

Figure 11:
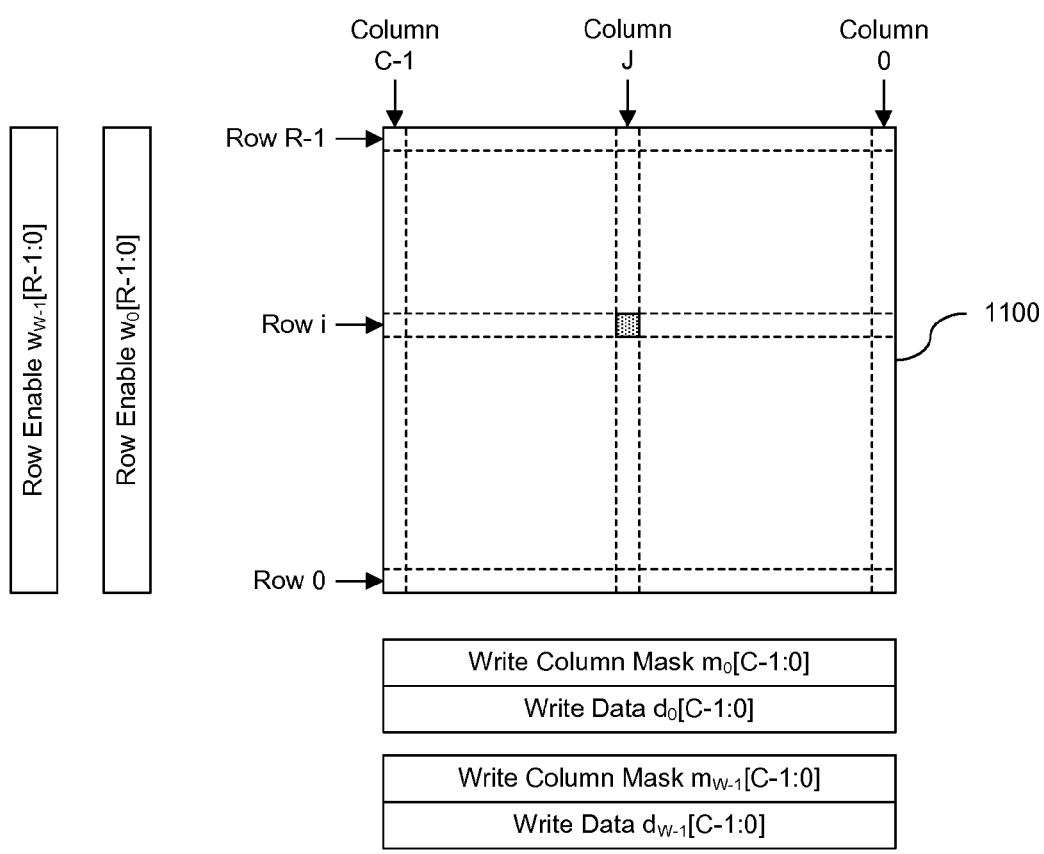
FIG. 11 is an eleventh block diagram illustrating a memory for use with a gearbox in accordance with another embodiment disclosed within this specification.

FIG. 11 is an eleventh block diagram illustrating a memory 1100 for use with a gearbox in accordance with another embodiment disclosed within this specification. Memory 1100 of FIG. 11 can be implemented substantially as described with reference to memory 515 described within this specification. Memory 1100, for example, can be implemented as a bit addressable memory having "W" write ports and organized as a matrix having "R" rows and "C" columns of bit cells. Each bit cell can be configured to store one bit.

In general, for a given write port k, where k=0, 1, ..., W−1, a write enable vector exists so that only one write port can write to a particular row at a time. A write enable vector $w_k[R-1:0]$ exists such that there is at most one 1 in $<w_0[i], w_1[i], ..., w_{W-1}[i]>$ for =0, 1, ... W−1. Further, there is a write data bit vector $d_k[C-1:0]$, and a write column mask $m_k[C-1:0]$ such that the input data bit $d_k[j]$ is written into bit cell (i,j) if and only if $w_k[i]=1$ and $m_k[j]=1$. It should be appreciated that in accordance with the relationships described, a single write port k can write the same bits into multiple rows when there are more than one 1 in the write enable vector $w_k$. The write circuitry, however, can be configured to prevent this scenario from occurring. For example, when the write circuitry is implemented in the form of a processor or a sequencer, a checking function can be implemented to ensure that the same bit is not enabled to be written by multiple ports of the memory.

Figure 12:
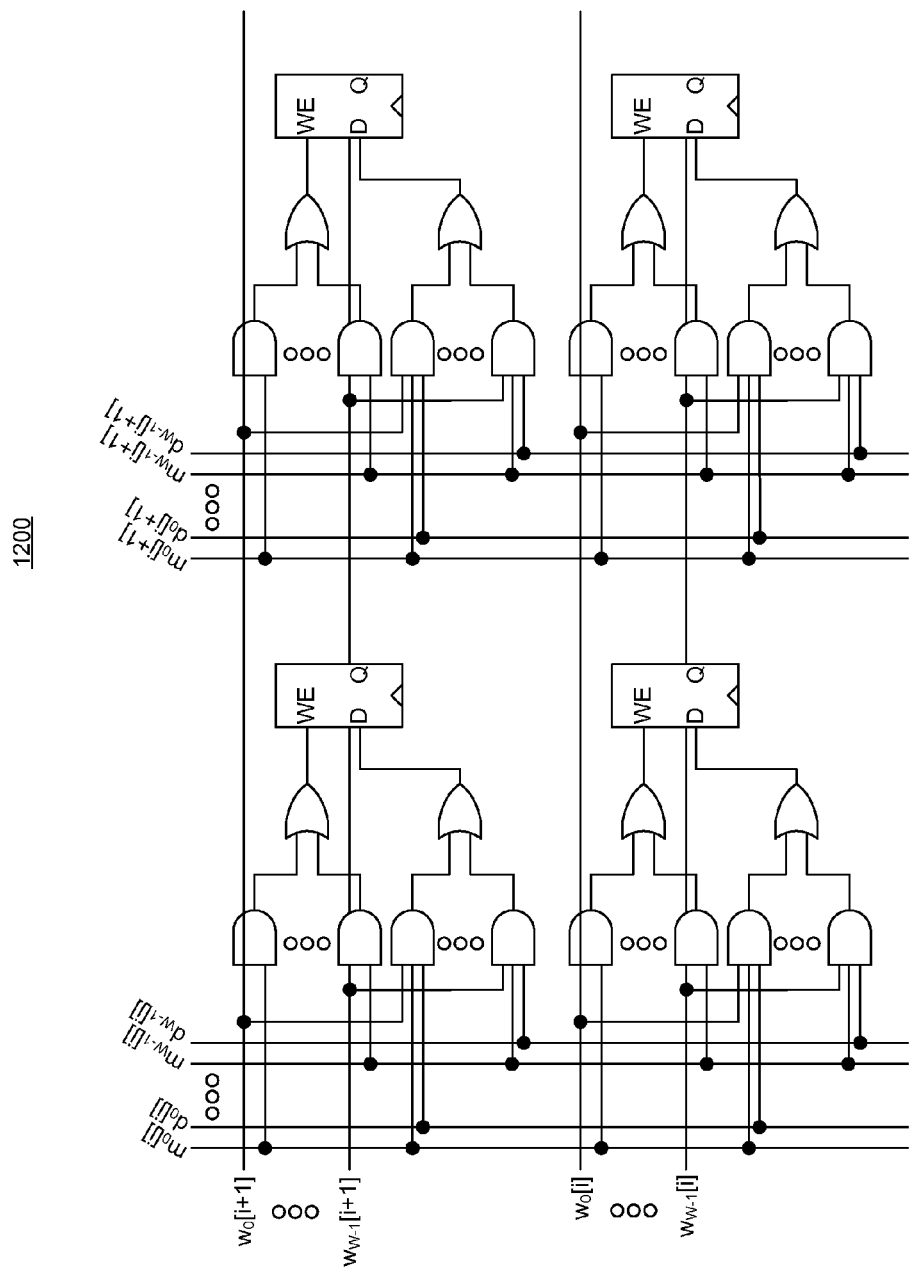
FIG. 12 is a first circuit diagram illustrating bit cell row and column decoding circuitry in accordance with another embodiment of disclosed within this specification.

FIG. 12 is a first circuit diagram illustrating bit cell row and column decoding circuitry 1200 in accordance with another embodiment of disclosed within this specification. Decoding circuitry 1200 illustrates that the write-enable port of a bit cell flip-flop is asserted when that particular bit cell is selected. Due to the configuration illustrated in FIG. 12 relating to the input port "D," when multiple write ports enable the same row, data can be corrupted since a logic-OR of all the unmasked data from all the write ports is performed. As noted, a checking function can be implemented to prevent the occurrence of this scenario.

Figure 13:
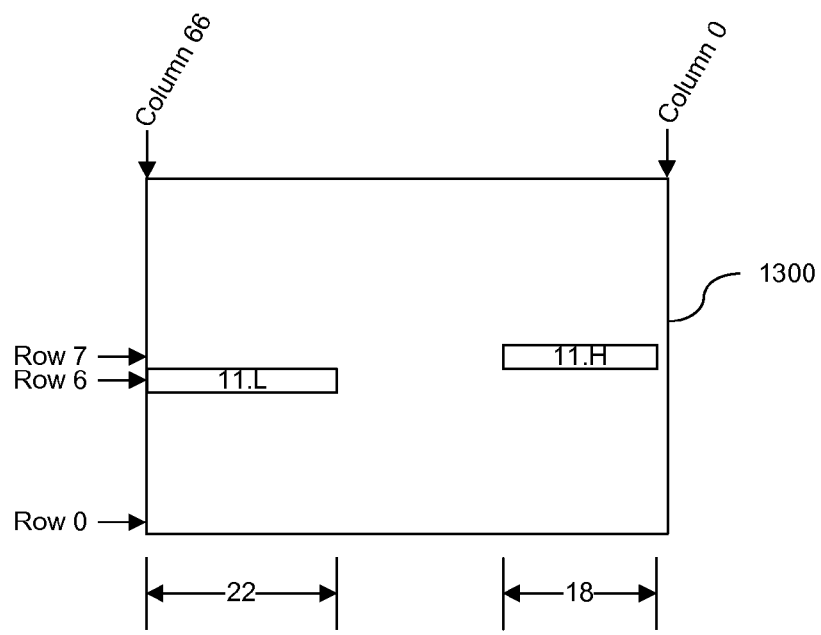
FIG. 13 is a twelfth block diagram illustrating a memory for use with a gearbox in accordance with another embodiment disclosed within this specification.

FIG. 13 is a twelfth block diagram illustrating a memory 1300 for use with a gearbox in accordance with another embodiment disclosed within this specification. FIG. 13 illustrates a memory that can be implemented substantially as described with reference to memory 515. FIG. 13 illustrates an example of a write operation in which memory 1300 includes at least two write ports. The various write enable vectors and write data bits vector can be generated by the write circuitry of the gearbox.

Consider the case in which the data being written into memory 1300 is a 40-bit word that can be represented as d[39: 0]. The 40-bit word is to be written into memory 1300, which has a 67-bit wide datapath, e.g., C=67. Due to prior written data within memory 1300, the 40-bit word must be split and written to the end portion of row 6 and the beginning portion of the next adjacent row 7. For purposes of illustration, 22 bits labeled "11.L" can be written to row 6. The remaining 18 bits can be written to row 7 and labeled as "11.H."

In order to write the 22 bits of subword 11.L into columns 46 to 67 of row 6 using write port 0, the 22 bits can be shifted using shifting circuit from $d_0[21:0]$ to $d_0[67:46]$. More particularly, the write circuitry can, via the shifting circuit, assign $d_0[67:46]=d_0[21:0]$. As discussed, the shifting circuit can include 40 input bits and 67 output bits.

Further, $w_0$ can be assigned to all 0s except $w_0[6]=1$, which enables row 6 for write by write port 0. Next, $m_0$ can be assigned all 0s except $m_0[67:46]=22'b1$, which, when taken together with the setting for $w_0$, enables bit cells 46 to 67 on row 6 for write by port 0. All other bits on row 6 remain the same as in the previous write cycle.

In order to write the 18 bits of the subword 11.H into columns 1 to 18 of row 7 using write port 1, the 18 bits can be shifted using the shifting circuit from $d_1[39:22]$ to $d_1[18:1]$. More particularly, the write circuitry can, via the shifting circuit, assign $d_1[18:1]=d_1[39:22]$. Next, $w_1$ can be assigned to all 0s except $w_1[7]=1$, which enables row 7 for write by write port 1. Next, $m_1$ can be assigned to all 0s except $m_1[18:1]=18'b1$, which, when taken together with the setting for $w_1$, enables bit cells 1 to 18 on row 7 for write by write port 1. It should be appreciated that suitable read vectors can be generated by the read circuitry of the gearbox in like manner.

As discussed, the read circuitry and/or the write circuitry can be implemented using one or more processors. In an embodiment, the write circuitry, e.g., write circuitry 505 of FIG. 5, can be configured to generate a sequence of read addresses according to instructions executed by the read circuitry that are stored within a memory. The write circuitry, for example, can be implemented as a processor configured to fetch instructions from program memory one instruction per clock cycle. It should be appreciated that while the read circuitry is not described, the read circuitry can be implemented in substantially the same manner using instructions of similar or the same syntax, for example.

An example syntax for a write instruction executable by the write circuitry can be in the form of <(row_a, write-enables_a), shift_a, (row_b, write-enables_b), shift_b, next_program_counter>. Thus, the argument "row_a" can indicate the particular row of memory to be enabled by the first port. The argument "write-enables_a" can indicate the write vector needed for write enabling the appropriate columns of memory to be written by the first port. The argument "shift_a" can indicate the number of bits the barrel shifter for the first port is to shift the input data to be written by the first port.

The argument "row_b" can indicate the particular row of memory to be enabled by the second port. The argument "write-enables_b" can indicate the write vector needed for write enabling the appropriate columns of memory to be written by the second port. The argument "shift_b" can indicate the number of bits the barrel shifter for the second port is to shift the input data to be written to by the second port. The "shift_a" and the "shift_b" can be different values as each barrel shifter, e.g., one barrel shifter for each port, can receive the same 40-bit word to be written, albeit to different columns. The argument "next_program_counter" can specify the location of the next instruction to be executed. For example, in one aspect, the entire address of the location of the next instruction can be specified. In another aspect, a binary bit can be used in order to utilize fewer bits. For example, a "0" value can indicate that the program counter should be incremented. A "1" value can indicate that the program counter is to jump to the program start address, which can be stored in a separate global control register. The global control register, for example, can be updated from time to time during operation of the gearbox as may be required to facilitate implementation of different state machines.

This "compound" type of instruction format specifies information usable by both the first and the second ports. Thus, the first and the second ports have the information needed for each to write to a particular row of the memory concurrently. The ability to write to more than one row of the memory at the same time allows a single word to be "wrapped" around from one row to the next during a single write operation (i.e., a single write clock cycle).

Referring to FIG. 7, the following example illustrates an exemplary instruction for writing the first 40-bit word labeled 0. For purposes of illustration, the convention "i'bj" indicates i consecutive identical bits j. For instance, 10 consecutive 0 bits can be denoted as "10'b0." Braces denote bit vector concatenation. Accordingly, five 1 bits followed by two 0 bits followed by sixty 1 bits can be denoted as {5'b1, 2'b0, 60'b1}.

In order to write the first 40 bit word denoted as 0 in FIG. 7, the following exemplary instruction can be used:

0: <(0, {26'b0,40'b1,0}), 1, (1, 67'b0), 0, 1>.

The first zero followed by the colon indicates the address at which the instruction is stored and the program counter value needed to execute the instruction. The first portion of the instruction is for port 0. Referring to row 0, column 0 is disabled while columns 1-40 are enabled to receive the 40 bit word. The shift value is 1 since the data is written beginning in column 1, which skips column 0. The remaining columns of row 0 are disabled. The second portion of the instruction pertains to port 1. Referring to row 1, all columns are disabled and a shift value of 0 is used. In this example, the "next program counter" argument can specify the next instruction address. The 1 value for the program counter argument indicates that the program counter is to execute the instruction at address "1."

In order to write the next 40 bit word composed of subwords 1.L and 1.H, the following exemplary instruction can be used:

1: <(0, {26'b1,41'b0}), 41, (1, {52'b0,14'b1, 0}), 1, 2>

The above instruction, as shown, can be stored at address "1," which stores the next instruction to be executed. The first portion of the instruction pertains to port 0 to write subword 1.L. Referring to row 0, columns 41-67 are enabled, while the remaining columns of row 0 are disabled. The shift value for the barrel shifter of port 0 is 41 since the data for word 1.L begins immediately after the prior 40-bit word. The second portion of the instruction pertains to port 1 to write subword 1.H. Referring to row 1, the remaining portion of 1.H is written to columns 1-14. The remaining columns, e.g., the columns following column 14 and column 0 are disabled. The 2 value for the "next program counter" argument indicates that the instruction at address "2" is to be executed next.

The example illustrated above shows how different state machines can be implemented by storing different sets of instructions within memory to be executed by the read circuitry and/or the write circuitry. The read and/or write circuitry can iterate through the instructions for a given finite state machine. The memory can store the instructions necessary for more than one finite state machine as illustrated within this specification. In the illustrations provided, for example, the starting program counter value need only be specified or loaded into the IC in order to start execution of the appropriate or desired finite state machine. The read and/or write circuitry, for example, can be configured to retrieve the starting address from a designated starting register responsive to various conditions, e.g., reset, startup, or another signal from user circuitry. The value stored in the designated starting register can be updated as desired during operation and at startup thereby allowing the finite state machine to be changed by writing a new address to the designated starting register during operation of the IC, which can be checked or read responsive to one or more specified operation conditions.

The read circuitry can be configured to read data out of the memory from the various regions described with reference to FIG. 10. As noted, the memory can be subdivided into a plurality of different rectangular regions. In the example illustrated in FIG. 10, six different regions are defined. Referring to FIG. 10, for example, each region can include five data segments. For instance, referring to FIG. 12, the "Q" output of each bit cell can be assigned, or belong, to a particular one of the regions. In one aspect, each region can be coupled to an output bus, which can be 175-bits wide in this example to accommodate the largest segments and/or group of segments read out of the memory. Referring again to the example of FIG. 10, regions 1, 3, and 5, when read, output only 160 bits. The 10 unused bits can be padded with predetermined values. Alternatively, additional bits can be read from even-numbered regions. The six output buses, e.g., one output bus for each region, can be multiplexed into one 175-bit bus as a primary output of the gearbox. It should be appreciated that in any case when the number of bits output from the gearbox is less then the physical number of data lines, the unused data lines can be padded with zeros or additional bits can be read from other regions.

The read circuitry can be configured to generate a read address that is the read region number and, thus, control the multiplexer to pass the data from a selected one of the six buses on to the primary output of the gearbox. In one example, the read circuitry can be configured to cycle through the region numbers. In that case, the read circuitry can be configured to generate the first address, or region, only responsive to determining that data in that region is valid, e.g., when the write circuitry has completed writing to that region.

Figure 14:
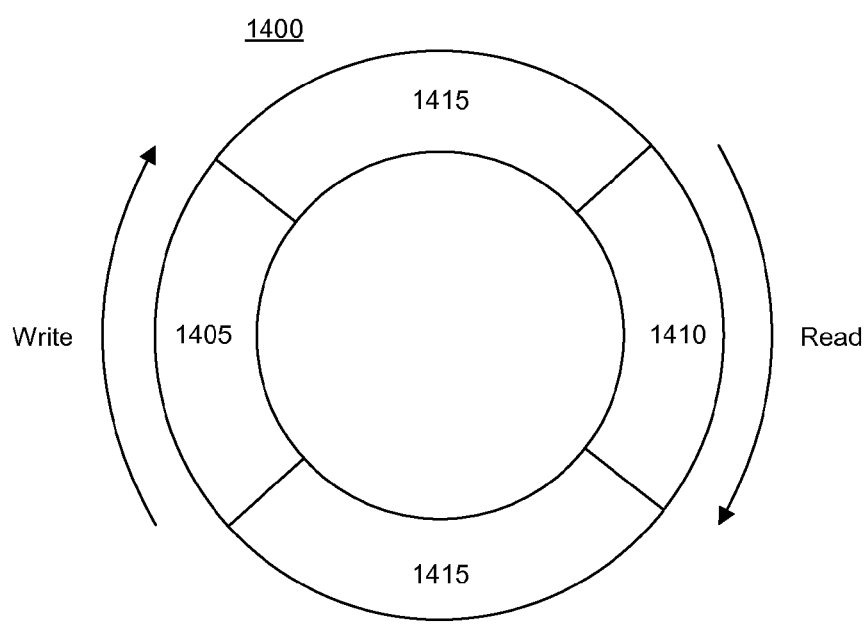
FIG. 14 is a thirteenth block diagram illustrating a memory for use with a gearbox in accordance with another embodiment disclosed within this specification.

FIG. 14 is a thirteenth block diagram illustrating a memory 1400 for use with a gearbox in accordance with another embodiment disclosed within this specification. FIG. 14 illustrates that memory 1400 of the gearbox can be implemented as a ring buffer that is bit-addressable with independent read pointer circuitry (e.g., the read circuitry) and independent write pointer circuitry (e.g., the write circuitry). As discussed, the read circuitry and the write circuitry can be controlled by two different clocks and/or the same group at the same time.

For purposes of discussion, two clocks having frequencies of f1 and f2 respectively can be said to be mesochronous when f1=f2, with either different or unknown phases. For instance, two clocks can be said to be mesochronous if each clock signal is output from one of two different delay lines driven by a single clock crystal. The two delay lines do not necessarily have identical delays. When f1 and f2 are derived from two separate crystals, however, the actual frequencies may not be equal, despite the difference or variation in frequency between f1 and f2 being measured in units as small as parts-per-million. As used within this specification, the phrase "R-mesochronous" can refer to a more general case. Two clocks can be said to be R-mesochronous if and only if f1/f2 can be expressed as a ratio between two integers. Defined in this manner, mesochronous becomes a special case of R-mesochronous.

In one aspect, the clock for the write circuitry (write clock) can have a frequency denoted as f1. The clock for the read circuitry (read clock) can have a frequency of f2. For purposes of illustration, the write clock and the read clock can be derived from a same, single clock source. Consider the case in which the 40-bits of data being written into the gearbox is clocked by a clock with f1=700 MHz and the read clock is determined by the expression f2=R*f1, wherein R=¼ providing a value of f2 as 175 MHz. The read and write clocks are thus R-mesochronous.

If during each cycle the read circuitry reads exactly M/R=40*4=160 bits, e.g., where M=40, the read circuitry will theoretically never need to be paused since the read circuitry consumes bits at exactly the same rate as bits are being written into the memory. Referring to FIG. 10, for example, where the read circuitry reads more than 160 bits on average in a cycle, the read circuitry must pause to avoid an underflow condition, e.g., and communicate the pause via one of the flow control signals. It also should be appreciated that the bit-slipping described within this specification as implemented by the shifting circuit necessitates flow control since even in the case where the read and write clocks are R-mesochronous, bit-slipping advances the read clock, thereby effectively changing the read rate. Accordingly, underflow still can occur due to bit-slipping without flow control.

FIG. 14 further illustrates that the read and the write addresses must be kept apart to avoid overlap. FIG. 14 illustrates that a read segment 1405 is prevented from overlapping with write segment 1410 by buffer zones 1415. Taking another example referring to FIG. 10, the read rows can be assigned or organized into three groups with group 1 formed of rows 0-4, group 2 formed of rows 5-9, and group 3 formed of rows 10 to 14. The write and the read addresses can be prevented from accessing the same segment of a row or a same group at the same time.

For systems in which the gearbox read and write clocks are R-mesochronous, the bit-addressable memory can double as a phase-compensation first-in-first-out (FIFO). Three or more segments may be useful for systems where the phase of either the read or the write clock can change within a known limit over time. One example of this situation can be the case where one of the read or write clocks switches over to a backup clock, for example, when the read or write clock (as the case may be) fails. For instance, a voltage controlled oscillator can multiplex a clock and a backup clock so there is no phase jump, e.g., where the rate of change in the phase does not exceed a predetermined rate of change, while switching from the clock to the backup clock. The phase occurs gradually from that of the clock to that of the backup. Additional storage in the bit-addressable memory can ensure that valid bits for the read port will be available since the read (write) rate during clock switching is different from that at the steady-state.

Figure 15:
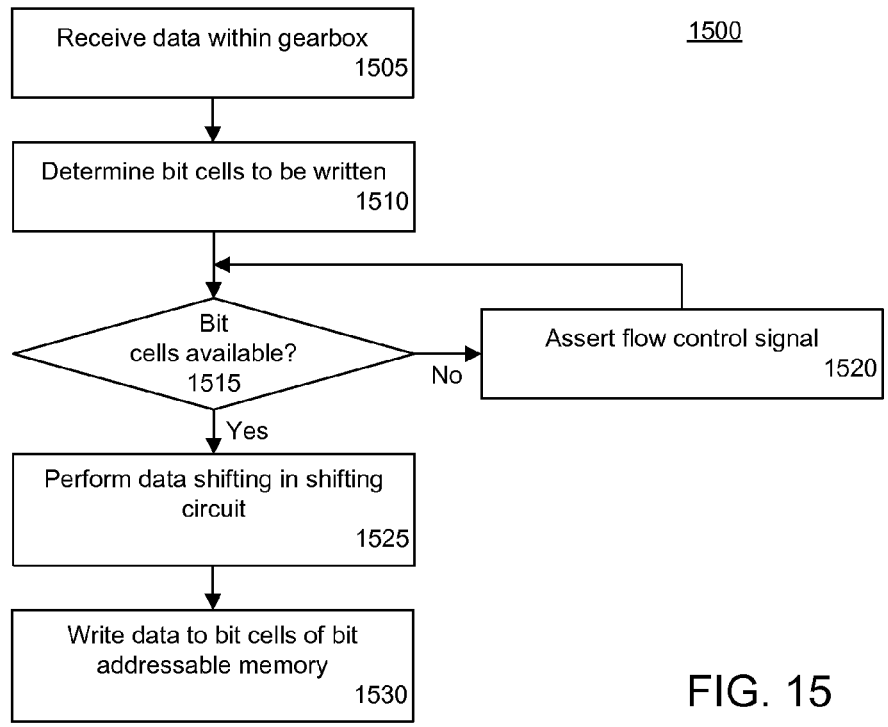
FIG. 15 is a first flow chart illustrating a method of writing data to a memory of a gearbox in accordance with another embodiment disclosed within this specification.

FIG. 15 is a first flow chart illustrating a method 1500 of writing data to a memory of a gearbox in accordance with another embodiment disclosed within this specification. Method 1500 can begin in a state in which a multi-protocol gearbox is implemented within a PHY of an IC structure as described with this specification. Accordingly, the write circuitry can be configured to implement a particular write finite state machine to control the writing of data to the bit addressable memory via the write port(s). Similarly, the read circuitry can be configured to implement a particular read finite state machine to control the reading of data from the bit addressable memory via the read port(s). The write circuitry further is configured to operate at a first frequency corresponding to the PHY.

Method 1500 can begin in step 1505, where the data can be received by the multi-protocol gearbox (gearbox). As discussed, the gearbox can be configured to receive data of a particular number of bits in width. For example, 40-bit words can be received within the shifting circuit, which can include a 40-bit input and an output having a larger number of bits that matches, e.g., is the same width as the number of columns of, the bit addressable memory. As noted, the bit addressable memory can be configured with 67 columns to accommodate 67 bits.

In step 1510, the write circuitry can determine the bit cells, e.g., addresses, of the bit addressable memory to which the data is to be written. The particular bit cells to which data is to be written can be determined according to the write finite state machine. More particularly, the write circuitry, in implementing the write finite state machine, can view the bit addressable memory in terms of a matrix of rows and column of bit cells. The write circuitry implements a write addressing scheme in which data is written to rows sequentially and to bit cells, e.g., columns, within each respective row sequentially. The particular write finite state machine that is implemented can dictate whether data is written into all columns, e.g., columns 0 to C−1, or a subset of the columns of the bit addressable memory, e.g., columns 1 to C−1.

In step 1515, the write circuitry can determine whether the bit cells identified in step 1510 are available per the semaphore circuitry. When the bit cells are available, method 1500 can proceed to step 1525. When the bit cells are not available, method 1500 can continue to step 1520. In step 1520, the gearbox can assert a flow control signal to prevent further data from entering the gearbox until such time that the gearbox is able to write data to the bit addressable memory. After step 1520, method 1500 can continue through to step 1515 to again determine bit cell availability.

Continuing with step 1525, the gearbox can perform data shifting as necessary. In one aspect, the write circuitry can control shifting performed by the shifting circuit based upon the particular data writing scheme that is implemented, e.g., the write finite state machine. For example, based upon which bit cells are available, the write circuitry can control the shifting circuit to effectuate any splitting of the received data among one or more different rows of the bit addressable memory as described. A shift of zero bits also can be implemented, e.g., when no shifting is required. In another aspect, the write circuitry can cause the shifting circuit to shift data in a particular direction and/or for a particular number of bits according to any received multi-bit slip request received from the PCS circuitry via the synchronization circuit.

In step 1530, the gearbox can write data to the identified bit cells of the bit addressable memory. As discussed, the write circuitry can control the write port(s) of the bit addressable memory to ensure that the data is written into rows sequentially and to columns within rows sequentially. As described, data can be written into one or more rows concurrently using the two or more read ports available as part of the bit addressable memory.

Figure 16:
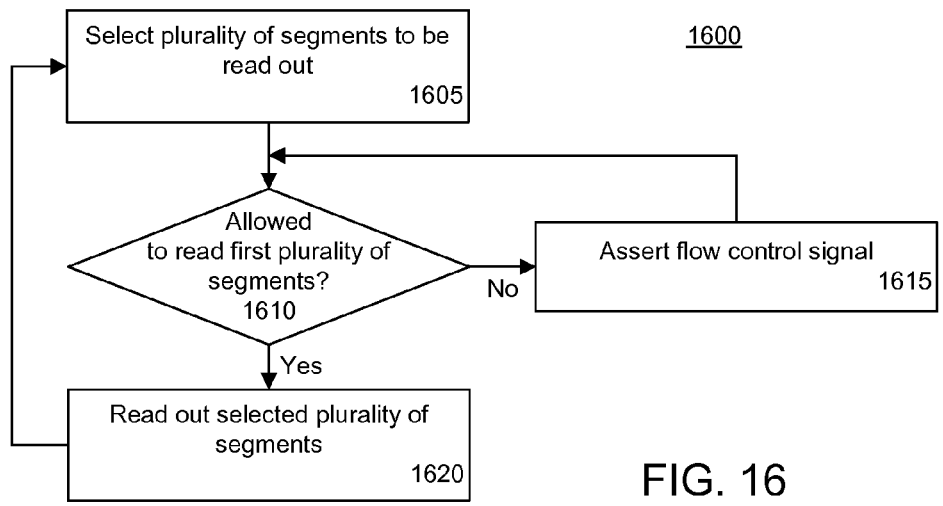
FIG. 16 is a second flow chart illustrating a method of reading data from a memory of a gearbox in accordance with another embodiment disclosed within this specification.

FIG. 16 is a second flow chart illustrating a method 1600 of reading data from a memory of a gearbox in accordance with another embodiment disclosed within this specification. Method 1600 can begin in a state in which a multi-protocol gearbox is implemented within a PHY of an IC structure as described with this specification. Accordingly, the write circuitry can be configured to implement a particular write finite state machine to write data to the bit addressable memory. Similarly, the read circuitry can be configured to implement a particular read finite state machine to read data from the bit addressable memory. The read circuitry can be configured to operate at a second frequency corresponding to the PCS, which is different and typically slower than the first frequency of the PHY. It should be appreciated that method 1600 can be performed concurrently by the gearbox with method 1500 of FIG. 15.

Method 1600 can begin in a state where the read circuitry can read data out of the bit addressable memory. As discussed, the read circuitry can split each row of the bit addressable memory into a plurality of different data segments. For example, the read circuitry can implement an addressing scheme in which each row is split into two data segments, in which a first data segment (even data segment referring to the previous examples when numbered beginning with zero, where zero is considered an even number) includes header bits and the second data segment does not include header bits (odd data segments).

In step 1605, the read circuitry can select a plurality of data segments to be read out of the bit addressable memory. The selected plurality of data segments, in this case a first plurality of data segments, can include two or more first data segments from different rows, e.g., two or more consecutive even numbered data segments. As noted, each first data segment can include header bits, or "expected" header bits in reference to bits believed to be header bits. Whether the first column is included in the first segments or excluded can depend upon the particular read and write finite state machines that are implemented.

In step 1610, the gearbox can determine whether the selected plurality of data segments can be read out. For example, the read circuitry can determine whether the selected plurality of data segments are allowed, or permitted, to be read out according to the semaphore circuitry. When the read circuitry determines that the selected plurality of segments can be read out, e.g., are allowed to be read out, method 1600 can continue to step 1620. When the read circuitry determines that the selected plurality of data segments are not permitted to be read out, method 1600 can continue to step 1615 to assert a flow control signal to the PCS circuitry, thereby informing the PCS circuitry of a delay in providing further data. After step 1615, method 1600 can loop back to step 1610 to continue checking whether the selected plurality of data segments can be read out.

Continuing with step 1620, the read circuitry can read out the selected plurality of data segments. After step 1620, method 1600 can loop back to step 1605 to select a next plurality of data segments to be read out. The next plurality of data segments can be data segments selected from two or more rows of the bit addressable memory that do not contain header bits or expected header bits, e.g., second or odd data segments. The read circuitry can continue to alternate between reading a plurality of data segments selected from two or more rows with header bits during one read cycle and a plurality of data segments selected from two or more rows without header bits in the next read cycle.

The one or more embodiments disclosed within this specification provide a multi-protocol gearbox that facilitates reuse of the circuit resources utilized. The bit addressable memory can be implemented to accommodate 67-bit data widths and thereby also accommodating 66-bit data width by excluding a particular column of bits. The read and write circuitry can be implemented so that through parameterization of the hardened circuits, different finite state machines can be implemented to cover a variety of different data width transformations.

The flowcharts in the figures illustrate the architecture, functionality, and operation of possible implementations of systems, methods and computer program products according to one or more embodiments disclosed within this specification. In this regard, each block in the flowcharts can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions. For example, as noted, the read circuitry and/or the write circuitry can be implemented in the form of processors in which blocks of the flowchart illustrations can represent either special purpose hardware and/or executable operations performed by the processors, e.g., responsive to executing program code.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. A system comprising:
    write circuitry configured to implement a write finite state machine selected from a plurality of write finite state machines;
    read circuitry configured to implement a read finite state machine selected from a plurality of read finite state machines; and
    a multi-port memory coupled to the write circuitry and the read circuitry,
    wherein the multi-port memory is a bit-addressable memory comprising a write port controlled by the write circuitry and a read port controlled by the read circuitry,
    wherein the write circuitry and the read circuitry are configured to implement the selected write finite state machine and the selected read finite state machine to perform one of a plurality of different data transformations using the multi-port memory, and
    wherein the write port is controlled by a first clock signal and the read port is controlled by a second clock signal that is different from the first clock signal.

2. The system of claim 1, wherein the write circuitry writes data to particular rows and columns of the bit addressable memory according to a write addressing scheme defined by the selected write finite state machine; and
    wherein the read circuitry reads data from particular rows and columns of the bit addressable memory according to a read addressing scheme defined by the selected read finite state machine, wherein the read addressing scheme differs from the write addressing scheme.

3. The system of claim 1, wherein the write circuitry is configured to control the write port of the bit addressable memory to write data into the bit addressable memory sequentially into rows and sequentially into columns of each row as determined by the selected write finite state machine.

4. The system of claim 1, wherein the read circuitry is configured to control the read port of the bit addressable memory to read data out of the bit addressable memory by dividing each of a plurality of rows of the bit addressable memory into a first data segment and a second data segment, and where a first data segment of a first row and a first data segment of a second row are read prior to reading the second data segment of the first row.

5. The system of claim 1, wherein the write circuitry is configured to write data of a first width into the multi-port memory and the read circuitry is configured to read data of a second width that is different from the first width from the multi-port memory.

6. The system of claim 1, wherein the read circuitry is configured to control the read port of the bit addressable memory to read data out of the bit addressable memory by dividing each of a plurality of rows of the bit addressable memory into a first data segment comprising expected header bits and a second data segment not comprising expected header bits, and where a first data segment of a first row and a first data segment of a second row are read prior to reading the second data segment of the first row.

7. The system of claim 1, wherein the write circuitry, the read circuitry, and the multi-port memory are implemented within a first die of a multi-die integrated circuit.

8. The system of claim 7, further comprising:
a second die comprising physical coding sublayer (PCS) circuitry coupled to the read circuitry,
wherein the PCS circuitry is configured to check alignment of data received from the read circuitry.

9. The system of claim 1, further comprising:
a shifting circuit, wherein the shifting circuit comprises an input of a first bit width and an output of a second bit width that is different from the first bit width, wherein the output is coupled to the write data port of the multi-port memory and controlled by the write circuitry,
wherein the shifting circuit is configured to shift data a selected number of bits responsive to a multi-bit slip request.

10. A system comprising:
a first die comprising adapter circuitry configured to implement a data transformation selected from a plurality of data transformations;
a second die comprising physical coding sublayer (PCS) circuitry coupled to the adapter circuitry,
wherein the PCS circuitry is configured to check alignment of data received from the adapter circuitry.

11. The system of claim 10, further comprising:
a third die comprising a plurality of metal wires,
wherein the first die is attached on a surface of the third die,
wherein the second die is attached on the surface of the third die,
wherein the first die and the second die are communicatively linked through the metal wires of the third die.

12. The system of claim 11, wherein the first die implements a physical medium attachment sublayer of the physical layer of the Open Systems Interconnection model.

13. The system of claim 10, wherein the second die is a programmable integrated circuit configured to implement the PCS circuitry.

14. A method of adapting width of a data stream comprising:
responsive to receiving data formatted according to a first bit-width, writing the data into a bit addressable memory using a first addressing scheme; and
reading the data out of the bit addressable memory in a format corresponding to a second bit-width that is different from the first bit-width using a second addressing scheme that is different from the first addressing scheme.

15. The method of claim 14, wherein writing the data into the bit addressable memory using the first addressing scheme comprises:
writing data to the bit addressable memory sequentially into rows and sequentially within columns of each row.

16. The method of claim 14, wherein reading the data out of the bit addressable memory comprises:
dividing each row of the bit addressable memory into a plurality of data segments; and
reading a first data segment from each of a plurality of rows of the bit addressable memory prior to reading a second data segment from the plurality of rows of the bit addressable memory.

17. The method of claim 14, wherein reading the data out of the bit addressable memory comprises:
dividing each of a plurality of rows of the bit addressable memory into a first data segment comprising expected header bits and a second data segment not comprising expected header bits; and
reading a first data segment of a first row and a first data segment of a second row prior to reading the second data segment of the first row.

18. The method of claim 14, further comprising:
writing the data into the bit addressable memory at a first frequency; and
reading the data out of the bit addressable memory at a second frequency that is different from the first frequency.

19. The method of claim 14, further comprising:
shifting the data by a plurality of bits prior to writing the data into the bit addressable memory.

20. A system comprising:
write circuitry configured to implement a write finite state machine selected from a plurality of write finite state machines;
read circuitry configured to implement a read finite state machine selected from a plurality of read finite state machines; and
a multi-port memory coupled to the write circuitry and the read circuitry,
wherein the multi-port memory is a bit-addressable memory comprising a write port controlled by the write circuitry and a read port controlled by the read circuitry,
wherein the write circuitry and the read circuitry are configured to implement the selected write finite state machine and the selected read finite state machine to perform one of a plurality of different data transformations using the multi-port memory, and
wherein the write circuitry is configured to write data of a first width into the multi-port memory and the read circuitry is configured to read data of a second width that is different from the first width from the multi-port memory.

* * * * *